United States Patent
Apel

(10) Patent No.: US 6,727,761 B1
(45) Date of Patent: Apr. 27, 2004

(54) RESONANT BYPASSED BASE BALLAST CIRCUIT

(75) Inventor: Thomas R. Apel, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 10/234,595

(22) Filed: Sep. 3, 2002

(51) Int. Cl.$^7$ .................................................. H03F 3/68

(52) U.S. Cl. ........................ 330/295; 330/302; 330/305

(58) Field of Search ................................ 330/289, 295, 330/296, 302, 305, 306; 327/108, 379, 365; 379/388.03, 390.01, 390.03, 395; 455/253.2, 343.1

(56) References Cited

U.S. PATENT DOCUMENTS

| | | | |
|---|---|---|---|
| 5,321,279 A | 6/1994 | Khatibzadeh et al. | 257/197 |
| 5,608,353 A | * 3/1997 | Pratt | 330/295 |
| 5,629,648 A | * 5/1997 | Pratt | 330/289 |
| 6,265,943 B1 | * 7/2001 | Dening et al. | 330/296 |

FOREIGN PATENT DOCUMENTS

EP    0 736 908 A1    10/1996

* cited by examiner

*Primary Examiner*—Long Nguyen
(74) *Attorney, Agent, or Firm*—Bever, Hoffman & Harms, LLP; James E. Parsons

(57) ABSTRACT

Base ballast resistors used to control thermal runaway are each bypassed with a series-resonant inductor and capacitor pair. In some embodiments each inductor and capacitor pair is unique. In other embodiments a common inductor is used for each inductor and capacitor pair.

31 Claims, 2 Drawing Sheets

RESONANT BYPASSED BASE BALLAST CIRCUIT

BACKGROUND

1. Field of Invention

The invention relates to transistor base ballast circuits.

2. Related Art

Heterojunction bipolar transistors (HBTs) are often formed as a group of associated transistor cells. Thermal runaway is a well-known problem in HBT amplifiers using two or more transistor cells connected in parallel. Slight physical variations in the transistor cells may cause one particular transistor cell to conduct more current than the other cells. Energy from the increased current is dissipated as heat. As the cell temperature increases, the cell's collector current also increases. In a runaway situation, therefore, a particular transistor cell eventually conducts more current than it is capable of dissipating and the transistor cell destroys itself.

There are several known methods to prevent such thermal runaway. One method is to control the base-emitter voltage by connecting each transistor cell emitter to ground via a resistor. The transistor base terminals are biased at a constant DC voltage. As collector current increases due to heating, the voltage drop across the emitter resistor increases. This increased voltage drop reduces the base-emitter voltage and consequently reduces the transistor's collector current. Thus heating is slowed. Among the disadvantages of such emitter ballast resistors are reduced radio frequency (RF) gain, increased thermal resistance of the transistor-emitter resistor combination, and difficulty in fabricating emitter ballast resistors with the required low resistance (e.g., about 2 ohms).

Another method used to prevent thermal runaway is the use of a base ballast resistor. As shown in FIG. 1, for example, ballast resistors 10,12 are coupled to the respective base terminals of HBT transistors 14,16. Capacitor 18 is coupled in parallel with resistor 10 and capacitor 20 is coupled in parallel with resistor 12. During operation, direct current from a bias voltage source (not shown) passes through resistors 10,12, thereby establishing a steady-state base-emitter voltage for each transistor 14,16. The RF input signal $RF_{IN}$ passes through capacitors 18,20. Transistors 14,16 amplify signal $RF_{IN}$ and consequently output signal $RF_{OUT}$. If heating causes one of transistors 14,16 to conduct excessive collector current, a corresponding increase in base current results. This increased base current causes an increased voltage drop across the associated base resistor. The increased voltage drop lowers the base-emitter voltage, and thus reduces the collector current in the overheating transistor. Base ballast resistor circuits are further described in U.S. Pat. No. 5,321,279 and European Patent Application EP 0 736 908 A1, both of which are incorporated by reference.

The circuit shown in FIG. 1 has disadvantages. Capacitors 18,20 must be sufficiently large to provide an effective RF bypass. The use of capacitors 18,20 as reactive tuning elements (i.e., not a bypass element where capacitive reactance is near zero) to provide reactive matches is precluded due to the resistive losses in parallel. At frequencies in the low microwave range (e.g., 1–2 GHz) and below, the area required to form the capacitors on an integrated circuit becomes impractical. During 800 MHz operation, for example, if ballast resistors 10,12 are each 125 ohms then capacitors 18,20 should each be about 15–20 pF. Depending on the integrated circuit fabrication process used, the chip area required to provide such capacitors in a 16-cell transistor amplifier output stage could easily be 0.5 $mm^2$.

FIG. 2 shows another base ballast resistor circuit configuration. In the circuit shown in FIG. 2, the nodes receiving the DC and RF input signals are separated. As shown in FIG. 2, the base terminal of each transistor 14,16 is connected to a unique resistor 22,24. The opposite terminals of resistors 22,24 are coupled together at a common DC bias input node. The base terminal of each transistor 14,16 is also coupled to one electrode of a unique capacitor 26,28. The opposite electrodes of capacitors 26,28 are coupled together at a common RF input node. Embodiments of the circuit shown in FIG. 2 are described in detail in U.S. Pat. Nos. 5,608,353 and 5,629,648, both of which are incorporated by reference. Capacitors 26,28 are smaller, and hence require less chip area, than capacitors 18,20 shown in FIG. 1 because capacitors 26,28 are typically reactive tuning elements.

Thus a need exists for a circuit providing effective base ballast capabilities and small size for RF signal frequencies at and below the low microwave range. Such a circuit should combine the benefits of the use of reactive tuning elements with a single input node receiving both the required DC bias signal and RF input signal for amplification.

SUMMARY

In a circuit using two or more transistor amplifier cells, a base ballast resistor is coupled between the base terminal of each unique transistor cell and a single input node receiving both a DC bias signal and an RF signal. Each ballast resistor is bypassed with a series-coupled inductor and capacitor that provide a resonant, low-loss RF signal current path between the input node and the base terminals of the transistor cells. In one embodiment a unique inductor and capacitor pair are used to bypass each base ballast resistor. The use of an inductor allows the capacitor to be made smaller than if no inductor is used. In another embodiment, a common inductor and parallel capacitors are used to form the resonant current paths between the input node and the base terminals. The use of a common inductor further reduces the chip area required by the base ballast circuit since the common inductor can be made smaller than the separate inductors.

DETAILED DESCRIPTION

In the accompanying drawings, like numbers indicate like elements. Skilled individuals will understand that known circuit elements (e.g., those providing bias and power supply voltages) are omitted so as to more clearly show the embodiments. Some embodiments are formed in gallium arsenide (GaAs) semiconductor technology, although other materials (e.g., indium phosphide) may be used.

Figure 3:
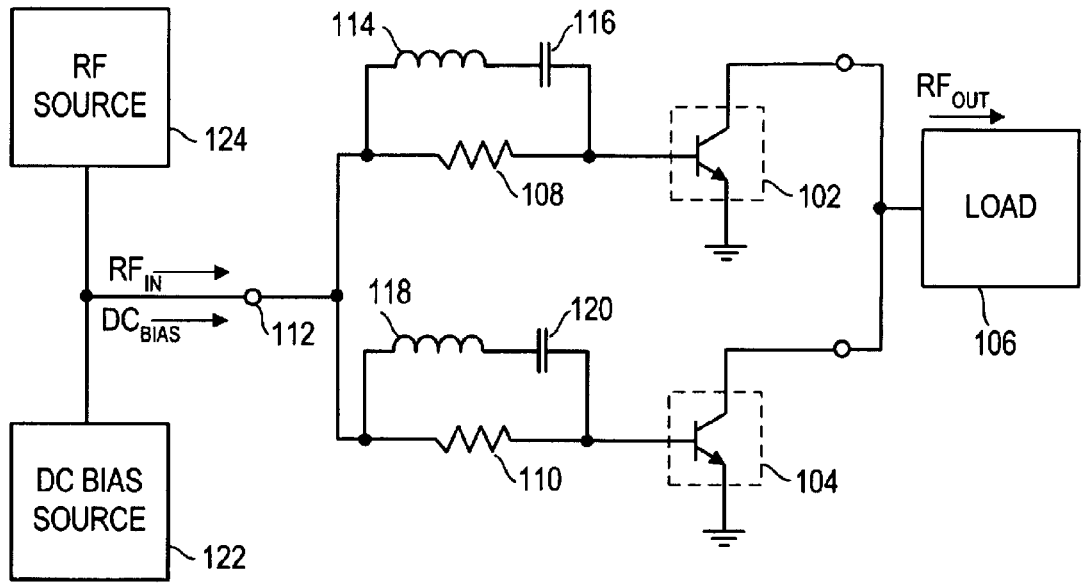
FIG. 3 is a schematic view of an electrical circuit using resonant bypassed base ballast resistors.

FIG. 3 is a schematic view of an electrical circuit incorporating resonant bypassed base ballast resistors. Two transistor cells 102,104 are shown and are illustrative of many parallel-connected transistors in, for example, an HBT final amplifier stage in a cellular telephone handset. Cells 102,104 are also illustrative of other parallel-connected transistor circuits. The collector terminals of transistor cells 102,104 are coupled together and output RF signal $RF_{OUT}$ to load 106 (e.g., an antenna; the collectors of transistor cells 102,104 are illustratively coupled together at a single output node, at which load 106 is coupled). The emitter terminals of cells 102,104 are coupled to ground (e.g., chassis ground).

In accordance with the invention, one terminal of base ballast resistor 108 is coupled to the base terminal of transistor cell 102 and one terminal of base ballast resistor 110 is coupled to the base terminal of transistor cell 104. The opposite terminals of resistors 108,110 are coupled together at input node 112. In some embodiments, resistors 108,110 are formed using thick film nickel chromium (NiCr) or tantalum nitride (TaN). One terminal of inductor 114 is coupled to one electrode of capacitor 116. The opposite terminal of inductor 114 is coupled to input node 112, and the opposite electrode of capacitor 116 is coupled to the base terminal of transistor cell 102. Likewise, one terminal of inductor 118 is coupled to one electrode of capacitor 120. The opposite terminal of inductor 118 is coupled to input node 112 and the opposite electrode of capacitor 120 is coupled to the base terminal of transistor cell 104. In some embodiments, inductors 114,118 are formed during thin film process steps depositing one or more metal layers. Thus series-connected inductor 114 and capacitor 116 bypass resistor 108, and series-connected inductor 118 and capacitor 120 bypass resistor 110. Although two transistor cells are shown in FIG. 3, the base ballast resistor and series-connected inductor. and capacitor combination is repeated for each transistor cell in embodiments having more than two cells (e.g., for a 16-cell final amplifier stage).

Conventional DC bias source 122 provides a DC bias signal to input node 112. This DC bias signal is received at the base terminals of transistor cells 102,104 via base ballast resistors 108,110 respectively. RF source 124 provides an RF signal to input node 112. Ballast resistors 108,110 are selected so as to not to present a high load to RF source 124. The RF signal from RF source 124 is received at the base terminals of transistor cells 102,104 via the inductor/capacitor pairs 114/116 and 118/120 which provide a low-loss signal path at the RF signal frequency. Capacitors 116,120 are sized to act as reactive tuning elements. Thus capacitors 116,120 are made considerably smaller than, for example, capacitors 18,20 described above with reference to FIG. 1 (see, e.g., TABLE I below).

Figure 4:
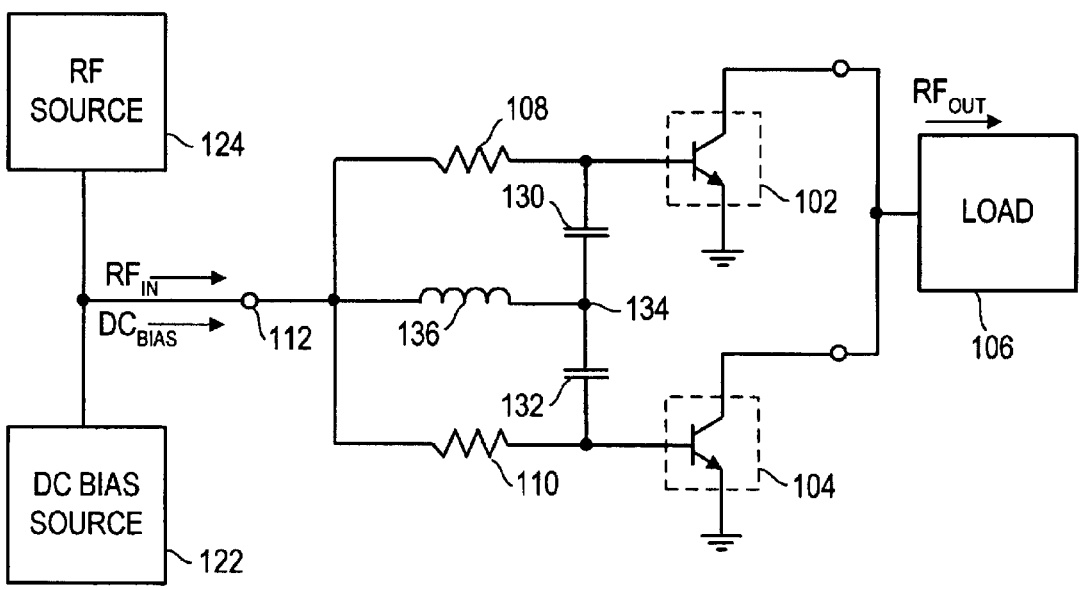
FIG. 4 is a schematic view of a second electrical circuit using resonant bypassed base ballast resistors.

FIG. 4 is a schematic view of a second electrical circuit incorporating resonant bypassed base ballast resistors. Base ballast resistors 108,110 are coupled between the respective base terminals of transistor cells 102,104 and input node 112 as described above with reference to FIG. 3. One electrode of capacitor 130 is coupled to the base terminal of transistor cell 102, and one electrode of capacitor 132 is coupled to the base terminal of transistor cell 104. The opposite electrodes of capacitors 130,132 are coupled together at a common node 134. One terminal of common inductor 136 is coupled to node 134. The opposite terminal of inductor 136 is coupled to input node 112. Although two transistor cells are shown in FIG. 4, the common inductor and multiple capacitor design is used in other embodiments having more than two transistor cells (e.g., for a 16-cell final amplifier stage).

During operation of the FIG. 4 embodiment, a DC signal from DC bias source 122 is received at the base terminals of transistor cells 102,104 via ballast resistors 108,110. The inductor 136 and capacitor 130 pair provides a low-loss path for the RF input signal from RF source 124 to the base terminal of transistor cell 102. Similarly, the inductor 136 and capacitor 132 pair provides a low-loss current path for the RF input signal from RF source 124 to the base terminal of transistor cell 104.

Figure 1:
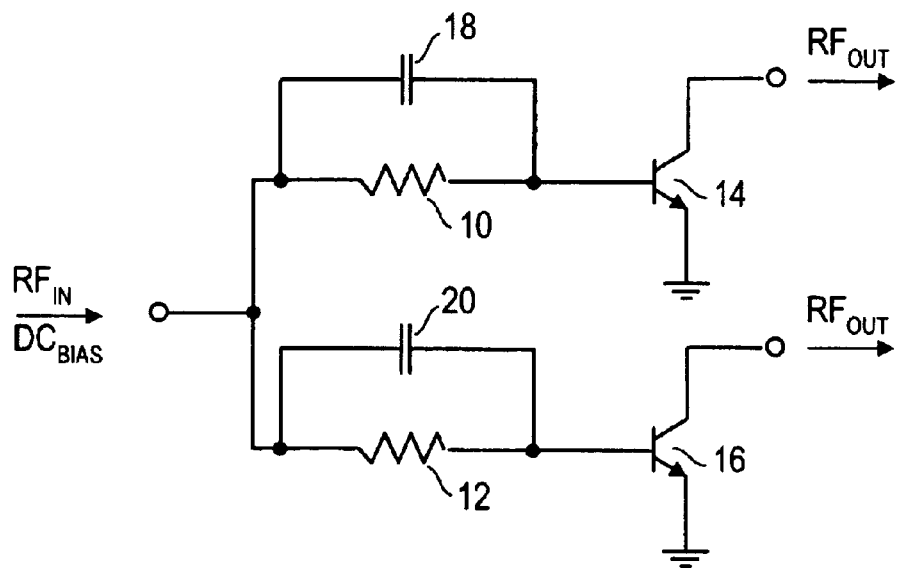
FIG. 1 is a schematic view of an electrical circuit using base ballast resistors.
Figure 2:
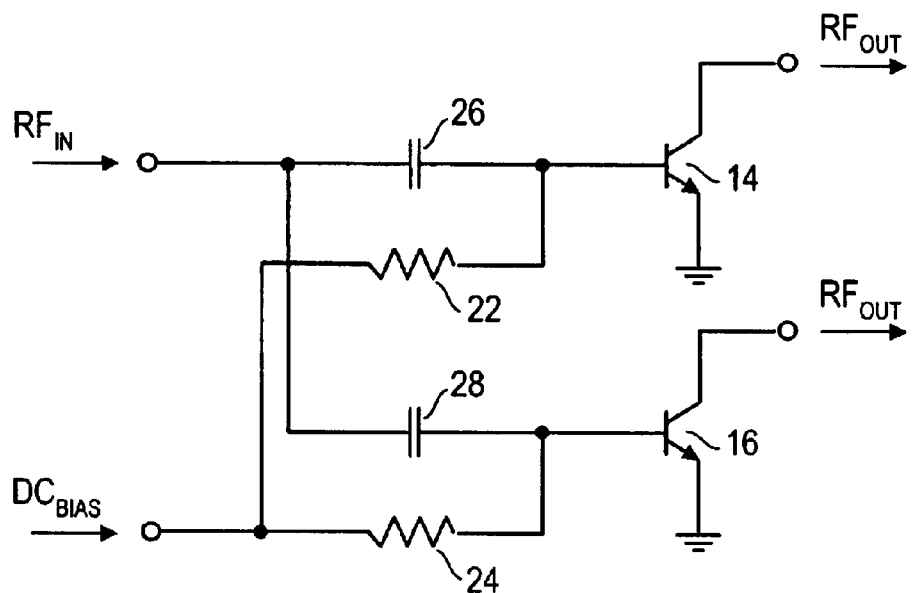
FIG. 2 is a schematic view of a second electrical circuit using base ballast resistors.

The value of inductor 136 as shown in FIG. 4 is less than the values of inductors 114,118 as shown in FIG. 3 by a factor of N, where N is the number of transistor cells. That is, for N cells, if the value of each inductor 114,118 is L, then the value of inductor 136 is L/N. Thus the chip area required for inductor 136 is considerably smaller than the chip area required for each of inductors 114, 118, especially in amplifiers using a large number (e.g., 10 or more) transistor cells. Further, since a series resonant circuit is formed by common inductor 136 and each of capacitors 130 and 132, the chip area required for capacitors 130,132 is less than the chip area required for capacitors 18,20 as shown in FIG. 1.

TABLE I lists illustrative component values used in the embodiments shown in FIGS. 3 and 4. These values are not limiting.

TABLE I

| Component | Value |
|---|---|
| Resistors 108,110 | 125 Ohm |
| Capacitors 18,20 | 15 pF |
| Capacitors 116,120 | 2 pF |
| Capacitors 130,132 | 2 pF |
| Inductors 114,118 | 3.6 nH |
| Inductor 136 | 1.8 nH |

Embodiments are useful in various applications using multiple, parallel-connected transistor cells. In one instance, for example, transistor cells 102,104 are illustrative of a final stage HBT amplifier advantageously used in a cellular telephone handset transmitting in a frequency range near about 900 MHz or about 1.9 GHz (e.g., frequency bandwidths allocated for operation by government agencies such as the Federal Communications Commission in the United States). Inductor/capacitor pairs are tuned to a particular frequency range of interest (e.g., about 900 MHz or about 1.9 GHz) so as to facilitate, for example, transmission of a wireless signal during cellular telephone handset operation. Another illustrative application of an embodiment is disclosed in concurrently filed U.S. patent application Ser. No. 10/234,614, filed on Sep. 3, 2002, by Stephen P. Bachhuber, Thomas R. Apel, and Robert E. Knapp entitled "Amplifier Power Control Circuit," which is incorporated herein by reference. Other embodiments may operate in other frequency ranges. The invention has been illustrated using specific embodiments. Skilled individuals will understand, however, that many variations, modifications, and substitutions may be made to the embodiments, and that the invention is limited only by the following claims.

I claim:

1. An electronic circuit comprising:
    an inductor comprising a first terminal and a second terminal, the second terminal being coupled to a node, wherein the node receives a DC bias signal for two or more transistor cells and receives a radio frequency input signal;
    a first capacitor coupled between the first terminal of the inductor and a base terminal of a first one of the transistor cells;
    a second capacitor coupled between the first terminal of the inductor and a base terminal of a second one of the transistor cells;
    a first resistor coupled between the second terminal of the inductor and the base terminal of the first transistor cell; and a second resistor coupled between the second terminal of the inductor and the base terminal of the second transistor cell.

2. The circuit of claim 1 further comprising a radio frequency signal source coupled to the second terminal of the inductor, wherein the radio frequency signal source provides the radio frequency input signal.

3. The circuit of claim 1 further comprising a direct current bias signal source coupled to the second terminal of the inductor, wherein the bias signal source provides the DC bias signal.

4. The circuit of claim 1, wherein each of the first and the second transistor cells comprises a collector terminal, and wherein the collector terminals of the first and the second transistor cells are coupled together.

5. The circuit of claim 1, wherein the inductor and the first capacitor form a series-resonant circuit having a resonant frequency in a particular frequency band.

6. The circuit of claim 1, wherein each of the first and the second transistor cells comprises a heterojunction bipolar transistor.

7. An electronic circuit comprising:
a first transistor cell and a second transistor cell;
a first resistor coupled between a base terminal of the first transistor cell and an input node, wherein the input node is coupled to receive a DC bias signal and a radio frequency input signal;
a second resistor coupled between a base terminal of the second transistor cell and the input node;
a first inductor and a first capacitor coupled in series, wherein the series-coupled first inductor and first capacitor are coupled between the base terminal of the first transistor cell and the input node; and
a second inductor and a second capacitor coupled in series, wherein the series-coupled second inductor and second capacitor are coupled between the base terminal of the second transistor cell and the input node.

8. The circuit of claim 7 further comprising a radio frequency signal source coupled to the input node, wherein the radio frequency signal source provides the radio frequency input signal.

9. The circuit of claim 7 further comprising a direct current bias signal source coupled to the input node, wherein the bias signal source provides the DC bias signal.

10. The circuit of claim 7, wherein each of the first and the second transistor cells comprises a collector terminal, and wherein the collector terminals of the first and the second transistor cells are coupled together.

11. The circuit of claim 7, wherein the first inductor and the first capacitor form a series-resonant circuit having a resonant frequency in a particular frequency band.

12. The circuit of claim 7, wherein each of the first and the second transistor cells comprises a heterojunction bipolar transistor.

13. A method, comprising the acts of:
providing a first transistor cell and a second transistor cell, each of said first and second transistor cells comprising a base terminal;
providing a first resistor between the base terminal of the first transistor cell and an input node, and a second resistor between the base terminal of the second transistor cell and the input node;
coupling the input node to receive a DC bias signal and a radio frequency input signal; and
providing a first series-resonant current path between the base terminal of the first transistor cell and the input node, and a second series-resonant current path between the base terminal of the second transistor cell and the input node, wherein each of the first and the second series-resonant current paths comprises an inductor coupled in series with a capacitor.

14. The method of claim 13 wherein the acts of providing the first series-resonant current path and the second series-resonant current path include using the same inductor to form the first and the second series-resonant current paths.

15. The method of claim 13, wherein each of the first and second transistor cells comprises a collector terminal, and further comprising the act of coupling together the collector terminals of the first and the second transistor cells.

16. The method of claim 13 further comprising the act of tuning the first and the second series-resonant current paths to have a resonant frequency in a particular frequency band.

17. The method of claim 13, wherein each of the first and the second transistor cells comprises a heterojunction bipolar transistor.

18. The method of claim 13, wherein the acts of providing the first series-resonant current path and the second series-resonant current path include using different inductors to form the first and the second series-resonant current paths.

19. An electronic circuit comprising:
a plurality of transistors each including a base terminal;
an input node for receiving a DC bias signal and an AC input signal;
a plurality of resistors and a plurality of capacitors, wherein the base terminal of each of said plurality of transistors is coupled to one of said resistors and one of said capacitors; and
at least one inductor, wherein the input node, each of said resistors, and each of said capacitors are coupled to said at least one inductor.

20. The electronic circuit of claim 19, wherein the plurality of transistors are heterojunction bipolar transistors.

21. The electronic circuit of claim 19, wherein the AC input signal is a radio frequency signal.

22. The electronic circuit of claim 19, wherein the electronic circuit is in a cellular phone.

23. The electronic circuit of claim 19, wherein said at least one inductor is a plurality of inductors, and each of the plurality of inductors is coupled to the input node, a respective one of said resistors, and a respective one of said capacitors.

24. The electronic circuit of claim 19, wherein said at least one inductor is only a single inductor, with the input node, each of said resistors, and each of said capacitors being coupled to the single inductor.

25. The electronic circuit of claim 19, wherein each of said plurality of transistors includes an emitter terminal, with the emitter terminal of each of said plurality of transistors being coupled to ground.

26. The electronic circuit of claim 25, wherein each of said plurality of transistors includes a collector terminal, with the collector terminals of the plurality of transistors being coupled together.

27. The electronic circuit of claim 23, wherein each of said plurality of transistors includes an emitter terminal and a collector terminal, the emitter terminal of each of said plurality of transistors being coupled to ground and the collector terminal of each of said plurality of transistors being coupled together.

28. The electronic circuit of claim 24, wherein each of said plurality of transistors includes an emitter terminal and a collector terminal, the emitter terminal of each of said plurality of transistors being coupled to ground and the collector terminal of each of said plurality of transistors being coupled together.

29. A method of providing a DC input signal and an AC input signal to a plurality of transistors, the method comprising:

receiving the DC input signal and the AC input signal at a first node of a circuit, said circuit including the plurality of transistors;

providing the DC input signal to a base terminal of each of said plurality of transistors through a respective one of a plurality of resistors, each of said plurality of resistors being coupled to the first node; and providing the AC input signal to the base terminal of each of said plurality of transistors through at least one inductor coupled in series with a respective one of a plurality of capacitors, said at least one inductor being coupled to the first node.

30. The method of claim 29, wherein said at least one inductor is a single inductor coupled to the first node, with each of the plurality of capacitors being coupled to said single inductor.

31. The method of claim 29, wherein said at least one inductor is a plurality of inductors, with each of said plurality of inductors coupled between the first node and the respective one of the plurality of capacitors.

* * * * *